United States Patent
Wang et al.

(10) Patent No.: US 10,389,967 B1
(45) Date of Patent: Aug. 20, 2019

(54) REMOVABLE ATTACHMENT STRUCTURE AND DISPLAY DEVICE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Na Wang, Shenzhen (CN); Cheng-Fa Chung, New Taipei (TW)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/019,692

(22) Filed: Jun. 27, 2018

(30) Foreign Application Priority Data

Mar. 12, 2018 (CN) .......................... 2018 1 0202040

(51) Int. Cl.
*H05K 5/00* (2006.01)
*H04N 5/64* (2006.01)
*H05K 5/02* (2006.01)
*G06F 1/16* (2006.01)

(52) U.S. Cl.
CPC ............ *H04N 5/64* (2013.01); *H05K 5/0017* (2013.01); *H05K 5/0204* (2013.01); *G06F 1/1637* (2013.01)

(58) Field of Classification Search
None
See application file for complete search history.

(56) References Cited

U.S. PATENT DOCUMENTS

| | | | | |
|---|---|---|---|---|
| 4,511,199 A * | 4/1985 | Erlam | .................. | H05K 7/1409 439/160 |
| 4,581,654 A * | 4/1986 | Kobayashi | ............. | H04N 3/127 348/790 |
| 4,644,095 A * | 2/1987 | Bright | .................... | H02B 1/305 174/16.1 |
| 4,772,562 A * | 9/1988 | Lau | ........................ | H01R 24/58 439/368 |
| 9,104,382 B2 * | 8/2015 | Chen | ..................... | G06F 1/1681 |
| 9,137,913 B2 * | 9/2015 | Hsu | ....................... | H05K 5/0221 |
| 9,594,398 B2 * | 3/2017 | Liang | .................... | G06F 1/1669 |
| 2012/0120566 A1 * | 5/2012 | Miao | ................... | H04M 1/0249 361/679.01 |

* cited by examiner

*Primary Examiner* — Courtney L Smith
*Assistant Examiner* — Rashen E Morrison
(74) *Attorney, Agent, or Firm* — ScienBiziP, P.C.

(57) ABSTRACT

A removable attachment structure includes a movable module and a latching module. The movable module includes a first receiving groove. The latching module includes a first mounting portion and a latching subassembly on the first mounting portion. One end of the latching subassembly and the first mounting portion defines an entrance, the entrance allows the movable module to enter into or come out of the latching module. For latching, the movable module vertically enters into the entrance and is driven to the latching subassembly until the latching subassembly is completely received in the first receiving groove. For unlatching, the movable module is driven in opposite direction until the latching subassembly is disengaged from the latching part, thereby disengaging the movable module from the entrance.

17 Claims, 6 Drawing Sheets

REMOVABLE ATTACHMENT STRUCTURE AND DISPLAY DEVICE

FIELD

The subject matter generally relates to removable attachment structure and a display device.

BACKGROUND

A television includes a display screen and a back plate. The display screen and the back plate are engaged by deformable hooks. However, such hooks may have a complex structure, and may cause difficult assembly and disassembly from the back plate.

Thus, there is room for improvement in the art.

BRIEF DESCRIPTION OF THE DRAWINGS

Implementations of the present technology will now be described, by way of example only, with reference to the attached figures.

DETAILED DESCRIPTION OF EMBODIMENTS

Figure 1:
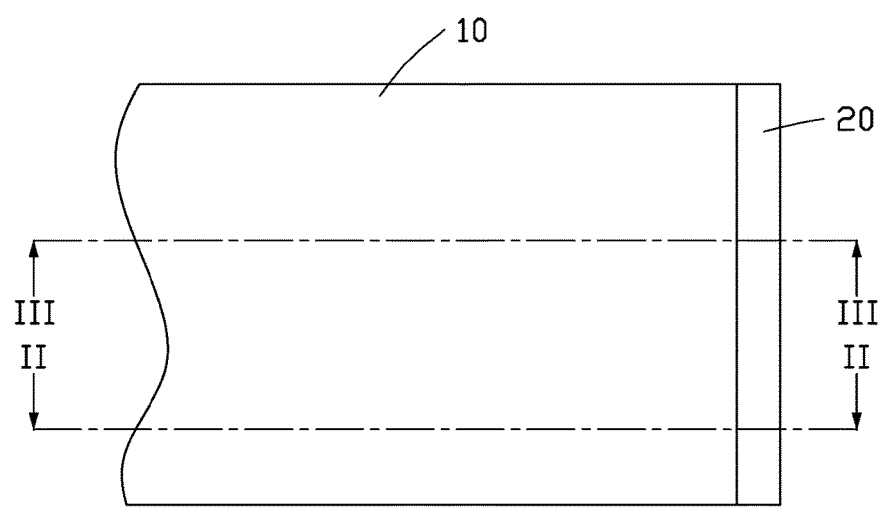
FIG. 1 is a top plan view of a first embodiment of a display device of the present disclosure.
Figure 2:
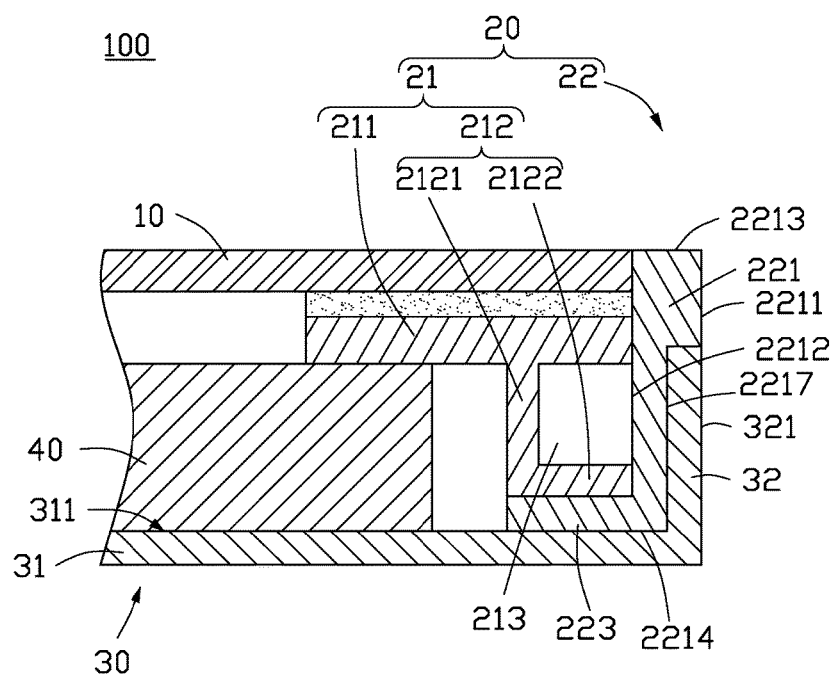
FIG. 2 is a cross-sectional view of the display device along line II-II of FIG. 1.
Figure 3:
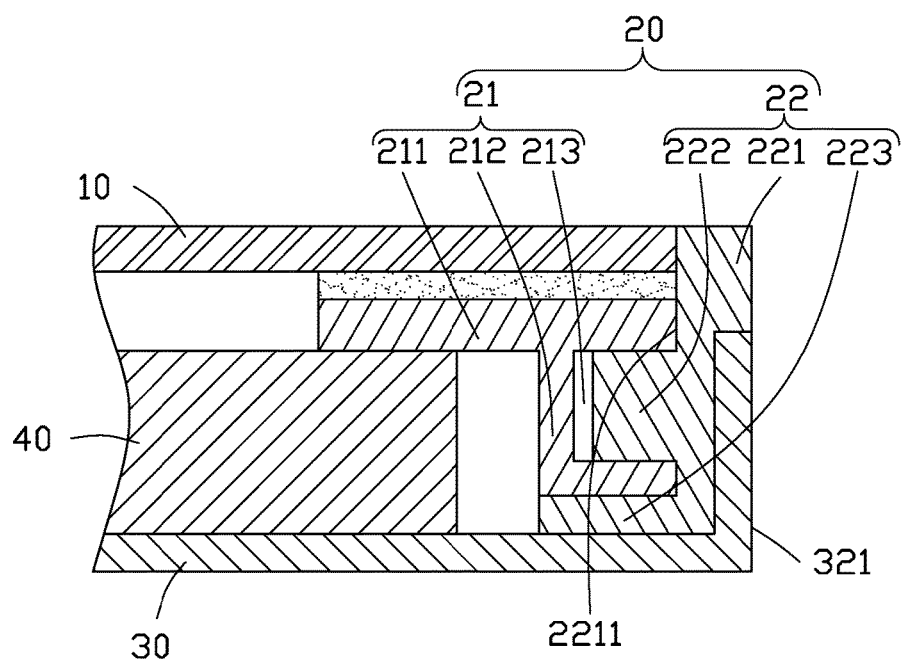
FIG. 3 is a cross-sectional view of the display device along line of FIG. 1.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

FIGS. 1-4 illustrate a first embodiment of a display device 100. The display device 100 includes a display screen 10, a removable attachment structure 20, a backplane 30, and an optical module 40. The display screen 10 and the backplane 30 are engaged by the removable attachment structure 20. The optical module 40 is fixed on the backplane 30 and faces the display screen 10.

The display screen 10 can be a liquid crystal display or a plasma panel. In at least one embodiment, the display screen 10 is a liquid crystal display.

The removable attachment structure 20 includes a movable module 21 and a latching module 22 engaging with the movable module 21. The movable module 21 can slide relative to the latching module 22.

The movable module 21 includes a supporting subassembly 211 and a movable subassembly 212. The movable subassembly 212 is formed on the supporting subassembly 211. In at least one embodiment, the supporting subassembly 211 and the movable subassembly 212 are integrally formed. In another embodiment, the movable subassembly 212 can be connected to the supporting subassembly 211 by screws or adhesive.

The movable subassembly 212 is substantially L-shaped. The movable subassembly 212 includes a longitudinal part 2121 and a lateral part 2122. The longitudinal part 2121 is perpendicular to the lateral part 2122. The longitudinal part 2121 is fixed on the supporting subassembly 211. A first receiving groove 213 is defined by the supporting subassembly 211, the longitudinal part 2121, and the lateral part 2122. The display screen 10 is fixed on the supporting subassembly 211 and faces away from the movable subassembly 212.

The latching module 22 includes a first mounting portion 221, a latching subassembly 222, and a second mounting portion 223. The latching subassembly 222 and the second mounting portion 223 are both formed on the first mounting portion 221. In at least one embodiment, the first mounting portion 221, the latching subassembly 222, and the second mounting portion 223 are integrally formed. In another embodiment, the latching subassembly 222 and the second mounting portion 223 can be connected to the first mounting portion 221 by screws or adhesive. The latching subassembly 222 is received in the first receiving groove 213.

In at least one embodiment, the first mounting portion 221 is substantially cubic.

The first mounting portion 221 includes a first side surface 2211, and a second side surface 2212 faces away from the first side surface 2211. A lower surface 2213 is perpendicularly connected to the first side surface 2211 and the second side surface 2212. A first upper surface 2214 faces away from the lower surface 2213, a front surface 2215 is perpendicularly connected to the lower surface 2213 and the second side surface 2212, and a rear surface 2216 faces away from the front surface 2215.

The first mounting portion 221 includes a second receiving groove 2217. In at least one embodiment, the second receiving groove 2217 penetrates through the first side surface 2211 and the lower surface 2213. In another embodiment, the second receiving groove 2217 penetrates only through the lower surface 2213.

In at least one embodiment, a surface of the lateral part 2122 parallel to the front surface 2215 is substantially rectangular.

The latching subassembly 222 is perpendicularly fixed on the second side surface 2212. The latching subassembly 222 is received in the first receiving groove 213 and can be slid along the first receiving groove 213. The latching subassembly 222, the movable subassembly 212, and the supporting subassembly 211 can be engaged to connect the screen 10 and the backplane 30 together. The latching subassembly 222 is formed on the second side surface 2212.

A sliding direction of the movable module 21 (that is, an extending direction from the front surface 2215 to the rear surface 2216) is defined to be a width direction.

The latching subassembly 222 is adjacent to the rear surface 2216. The latching subassembly 222 has a width less than the width of the first mounting portion 221 or a width of the second mounting portion 223.

The first mounting portion 221 and the latching subassembly 222 define a third receiving groove 224. The third receiving groove 224 can receive the display screen 10 and ends of the supporting subassembly 211.

The first mounting portion 221, the latching subassembly 222 and the second mounting portion 223 define a fourth receiving groove 225. The fourth receiving groove 225 can receive the lateral part 2122.

One end of the latching subassembly 222 and the first mounting portion 221 define an entrance 226. The entrance 226 is connected to the third receiving groove 224 and the fourth receiving groove 225.

The entrance 226 allows the movable subassembly 212 to enter into the third receiving groove 224 or come out of the third receiving groove 224. This facilitates the assembly or disassembly of the movable module 21 and the latching module 22.

The entrance 226 has a width equal to or greater than a width of the lateral part 2122, thereby allowing the movable subassembly 212 to easily enter the entrance 226.

The second mounting portion 223 is perpendicularly formed on the second surface 2212.

In at least one embodiment, the second mounting portion 223 has a same width as that of the first mounting portion 221.

When the movable module 21 is engaged with the latching module 22, the latching part 2221 is received in the first receiving groove 213. The lateral part 2122 and one end of the supporting subassembly 211 both abut against the second side surface 2212.

The backplane 30 includes a bottom plate 31 and a side plate 32. The side plate 32 is formed on one end of the bottom plate 31. In at least one embodiment, the side plate 32 and the bottom plate 31 are integrally formed. In another embodiment, the side plate 32 and the bottom plate 31 can be fixed on the bottom plate 31.

The bottom plate 31 includes a second upper surface 311. The side plate 32 is perpendicularly fixed on the second upper surface 311. The latching module 22 is fixed on the second upper surface 311. In at least one embodiment, the first mounting portion 221 and the second mounting portion 223 are both fixed on the second upper surface 311. The side plate 32 is received in the second receiving groove 2217.

The side plate 32 includes a third side surface 321. The third side surface 321 is parallel to the first side surface 2211.

In at least one embodiment, the first side surface 2211 is flush with the third side surface 321.

The second mounting portion 223 and the latching subassembly 222 can be located on one the same side or different sides of the first mounting portion 221. In at least one embodiment, the second mounting portion 223 and the latching subassembly 222 are located at one side of the first mounting portion 221.

The optical module 40 provides light to illuminate the display screen 10.

The optical module 40 is fixed on the second upper surface 311 and faces the display screen 10.

The optical module 40 and the movable subassembly 212 are located at one side of the first mounting portion 221.

Figure 5:
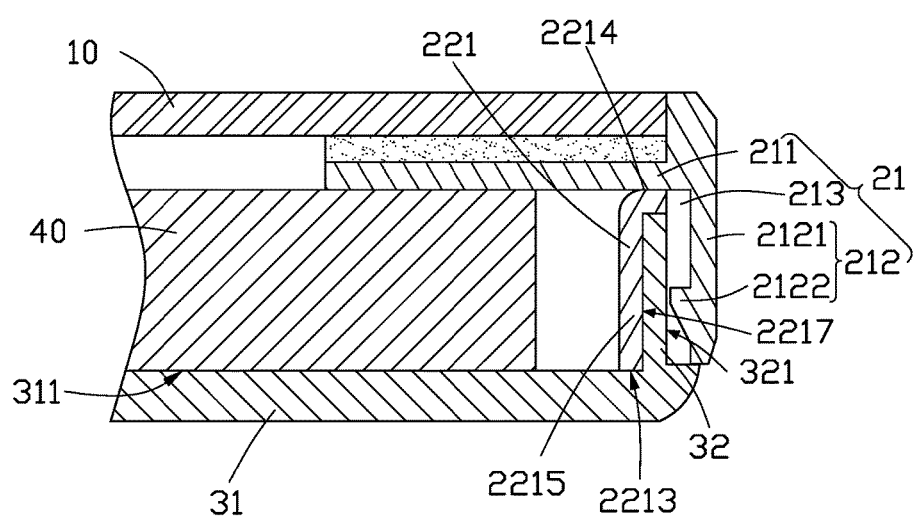
FIG. 5 is cross-sectional view of a second embodiment of a display device.
Figure 6:
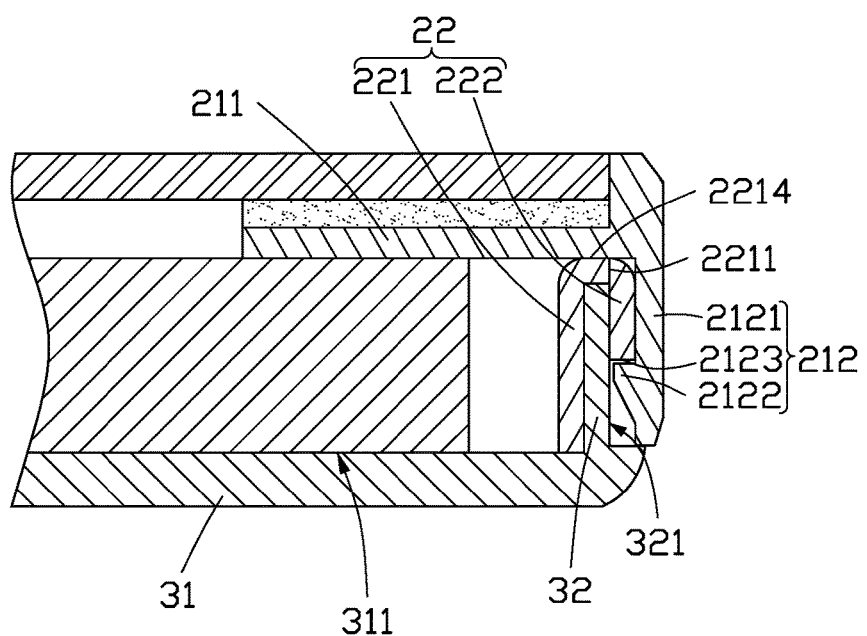
FIG. 6 is similar to FIG. 5, but showing another section of the display device.

FIGS. 5 to 6 illustrate a second exemplary embodiment of a display device 200. The difference between the display device 200 and the display device 100 of the first embodiment is that the latching subassembly 222 is formed on the first side surface 2211 and abuts against the side plate 32. The fourth receiving groove 225 is defined by the bottom plate 31, the side plate 32, and the latching subassembly 222. When the movable subassembly 212 is engaged with the latching module 22, the supporting subassembly 211 abuts against the first upper surface 2214. The lateral part 2122 is received in the fourth receiving groove 225 and abuts against the third side surface 321 or against one end of the latching subassembly 222.

In at least one embodiment, the latching subassembly 22 has a surface that is flush with the first upper surface 2214.

Figure 4:
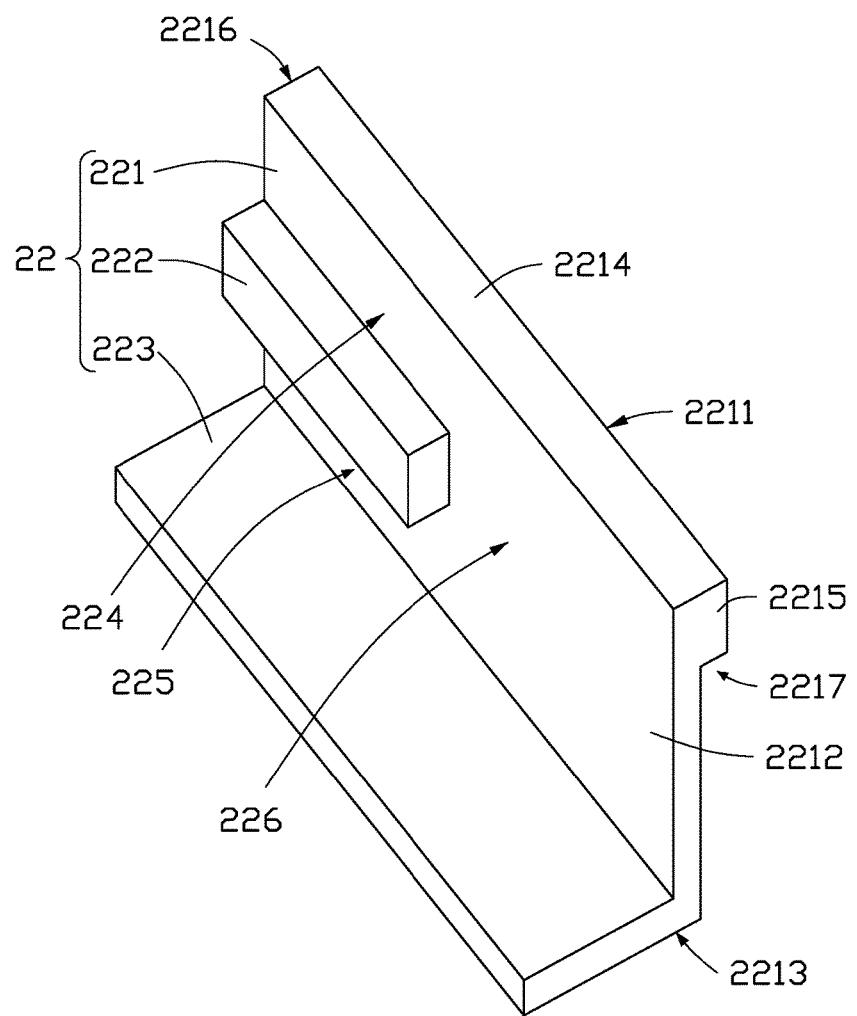
FIG. 4 is a diagrammatic view of a latching module of the display device of FIG. 3.

In at least one embodiment, the second mounting portion 223 in FIG. 4 can be omitted from the latching module 22.

The assembly of the display devices 100, 200 may include the following steps. Firstly, the latching module 22 is fixed on the bottom plate 31. At this time, the side plate 32 is received in the second receiving groove 2217. Next, the optical module 40 is disposed on the bottom plate 31. Again, the display screen 10 is fixed or glued on the supporting subassembly 211. Finally, the movable subassembly 212 is disposed in the entrance 226 and the display screen 10 is pushed toward the latching subassembly 222. The display screen 10 drives the movable module 21 to slide on the second mounting portion 223 or directly on the bottom plate 31 until the latching subassembly 222 is completely received in the first receiving groove 213, this achieves engagement between the display screen 10 and the backplane 30.

The disassembling of the display devices 100, 200 may include the following steps. Firstly, the display screen 10 is pushed in an opposite direction. The display screen 10 drives the removable attachment structure 20 to slide toward the entrance 226 until the latching subassembly 222 is completely detached from the first receiving groove 213. Secondly, the display screen 10 and the movable module 21 are moved vertically upward from the entrance 226, to disassemble the movable module 21 from the latching module 22.

With the above configuration, whilst the latching module 22 includes the movable module 21 the latching module 22 is independent from the movable module 21. The latching module 22 includes the latching subassembly 222. Thus assembler can put the movable module 21 into the latching module 22 through the entrance 226 and can drive the movable module 21 to slide on the second mounting portion 223 or directly on the bottom plate 31. Assembly and disassembly of the movable module 21 in relation to the latching module 22 can be achieved by sliding.

The embodiments shown and described above are only examples. Many details are often found in the art such as the other features of the removable attachment structure and the display device. Therefore, many such details are neither shown nor described. Even though numerous characteristics and advantages of the present technology have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A removable attachment structure comprising: a movable module, the movable module comprising a supporting subassembly and a movable subassembly on the supporting subassembly, the movable subassembly comprises a longitudinal part and a lateral part perpendicular to the lateral part, a first receiving groove being defined by the supporting subassembly, the longitudinal part, and the lateral part and the first receiving groove being defined by the supporting subassembly, the longitudinal part, and the lateral part: and a latching module mating with the movable module, the latching module comprising a first mounting portion and a latching subassembly formed on the first mounting portion; and an entrance being defined by one end of the latching subassembly and the first mounting portion; the entrance allowing the movable module to enter into or come out of the latching module; wherein when the movable module is: to be engaged with the latching module, the movable module enters into the entrance to make the latching subassembly to be outside the first receiving groove and is driven to the latching subassembly until the latching subassembly is completely received in the first receiving groove; to be disengaged from the latching module, the movable module is driven in opposite direction until the latching subassembly is disengaged from the first receiving groove, thereby disengaging the movable module from the entrance.

2. The removable attachment structure of claim 1, wherein the latching subassembly has a width less than the width of the first mounting portion.

3. The removable attachment structure of claim 1, wherein the entrance has a width that is greater than or equal to a width of the lateral part.

4. The removable attachment structure of claim 1, wherein the supporting subassembly and the movable subassembly are integrally formed.

5. The removable attachment structure of claim 1, wherein the movable subassembly is fixed on the supporting subassembly.

6. The removable attachment structure of claim 1, wherein the first mounting portion comprises:
   a first side surface and a second side surface faces away from the first side surface, the latching subassembly is formed on the second side surface, and
   when the movable module is engaged with the latching module, the lateral part and one end of the supporting subassembly are both abut on the second side surface.

7. The removable attachment structure of claim 1, wherein the first mounting comprises a first side surface and a second side surface faces away from the first side surface, the latching subassembly is formed on the first side surface, when the movable subassembly is engaged with the latching module, the supporting subassembly abuts against the first mounting portion.

8. The removable attachment structure of claim 1, wherein the latching module further comprises a second mounting portion on the first mounting portion, the first mounting portion, the latching subassembly and the second mounting portion define a fourth receiving groove connected to the entrance, the fourth receiving groove is used to receive the lateral part.

9. The removable attachment structure of claim 8, wherein the second mounting portion and the latching subassembly are located on the same side or different sides of the first mounting portion.

10. A display device comprising: a display screen, a backplane, and a removable attachment structure engaged the display screen to the backplane; wherein, the removable attachment structure comprising: a movable module, the movable module comprising a first receiving groove a supporting subassembly and a movable subassembly on the supporting subassembly, the movable subassembly comprises a longitudinal part and a lateral part perpendicular to the lateral part, the first receiving groove being defined by the supporting subassembly, the longitudinal part, and the lateral part and a first receiving groove being defined by the supporting subassembly, the longitudinal part, and the lateral part: and a latching module mating with the movable module, the latching module comprising a first mounting portion and a latching subassembly on the first mounting portion; and an entrance being defined by one end of the latching subassembly and the first mounting portion; the entrance allows the movable module to enter into or come out of the latching module; wherein: when the movable module is to be engaged with the latching module, the movable module enters into the entrance to make the latching subassembly to be outside the first receiving groove and is driven to the latching subassembly until the latching subassembly is received in the first receiving groove; and when the movable module is to be disengaged from the latching module, the movable module is driven in opposite direction until the latching subassembly is disengaged from the first receiving groove, thereby disengaging the movable module from the entrance.

11. The display device of claim 10, wherein the latching module further comprises a second mounting portion on the first mounting portion, the first mounting portion, the latching subassembly and the second mounting portion define a fourth receiving groove connected to the entrance, the fourth receiving groove is used to receive the lateral part.

12. The display device of claim 10, wherein the backplane comprises a bottom plate and a side plate on the bottom plate, the first mounting portion comprises a second receiving groove, the side plate is received in the second receiving groove; the first mounting portion and the second mounting portion are both formed on the backplane.

13. The display device of claim 10, wherein the supporting subassembly and the movable subassembly are integrally formed.

14. The display device of claim 10, wherein the first mounting portion comprises a first side surface and a second side surface faces away from the first side surface, the latching subassembly is formed on the second side surface, when the movable module is engaged with the latching module, the lateral part and one end of the supporting subassembly both abut the second side surface.

15. The display device of claim 10, wherein the first mounting comprises a first side surface and a second side surface faces away from the first side surface, the latching subassembly is formed on the first side surface, when the movable subassembly is engaged with the latching module, the supporting subassembly abuts against the first mounting portion.

16. The display device of claim 10, wherein the latching module further comprises a second mounting portion on the first mounting portion, the first mounting portion, the latching subassembly and the second mounting portion define a fourth receiving groove connected to the entrance, the fourth receiving groove is used to receive the lateral part.

17. The display device of claim 16, wherein the second mounting portion and the latching subassembly are located on the same side or different sides of the first mounting portion.

* * * * *